United States Patent [19]

Schweitzer, Jr.

[11] Patent Number: 4,458,198

[45] Date of Patent: Jul. 3, 1984

[54] FAULT INDICATOR HAVING A REMOTE TEST POINT AT WHICH FAULT OCCURRENCE IS INDICATED BY CHANGE IN MAGNETIC STATE

[76] Inventor: Edmund O. Schweitzer, Jr., 1002 Dundee Rd., Northbrook, Ill. 60062

[21] Appl. No.: 458,901

[22] Filed: Jan. 18, 1983

Related U.S. Application Data

[63] Continuation of Ser. No. 103,042, Dec. 13, 1979, abandoned.

[51] Int. Cl.$^3$ .................... G01R 19/12; G01R 31/02
[52] U.S. Cl. .................................... 324/133; 324/51; 340/650
[58] Field of Search ............ 324/133, 51, 102, 117 R, 324/127; 340/650, 654, 659, 664

[56] References Cited

U.S. PATENT DOCUMENTS

| | | | |
|---|---|---|---|
| 3,210,750 | 10/1965 | Leonard | 340/650 |
| 3,406,388 | 10/1968 | Phil | 324/133 |
| 3,480,863 | 11/1969 | Hopengarten | 324/133 |
| 3,513,354 | 5/1970 | Tachick | 340/654 |
| 3,657,650 | 4/1972 | Arndt | 324/133 |
| 3,906,477 | 9/1975 | Schweitzer, Jr. | 324/133 |
| 3,991,366 | 11/1976 | Schweitzer, Jr. | 324/133 |

Primary Examiner—Gerard R. Strecker
Assistant Examiner—Walter E. Snow
Attorney, Agent, or Firm—Lockwood, Dewey, Alex & Cummings

[57] ABSTRACT

A fault indicator for use in conjunction with components of a power distribution system contained within a protective enclosure includes a magnetic test point on the exterior surface of the enclosure for indicating the occurrence of a fault in associated circuits of the system. The fault indicator includes a circuit module mounted on a conventional test-point provided on one of the system components, and a magnetic indicator module mounted on the wall of the enclosure. The indicator module includes a magnetizable element which extends through the wall of the housing to provide a magnetic test point. Upon occurrence of a fault in the system, circuitry within the indicator module energizes a first winding in the indicator module to establish a magnetic state of a first polarity at the test point. Upon restoration of power, a reset circuit energizes a second winding to establish a magnetic state of opposite polarity at the test point. A portable test instrument comprising a hand held housing on which a magnetized flag member is rotatably mounted is positioned adjacent the magnetic test point by a lineman to determine circuit status.

46 Claims, 9 Drawing Figures

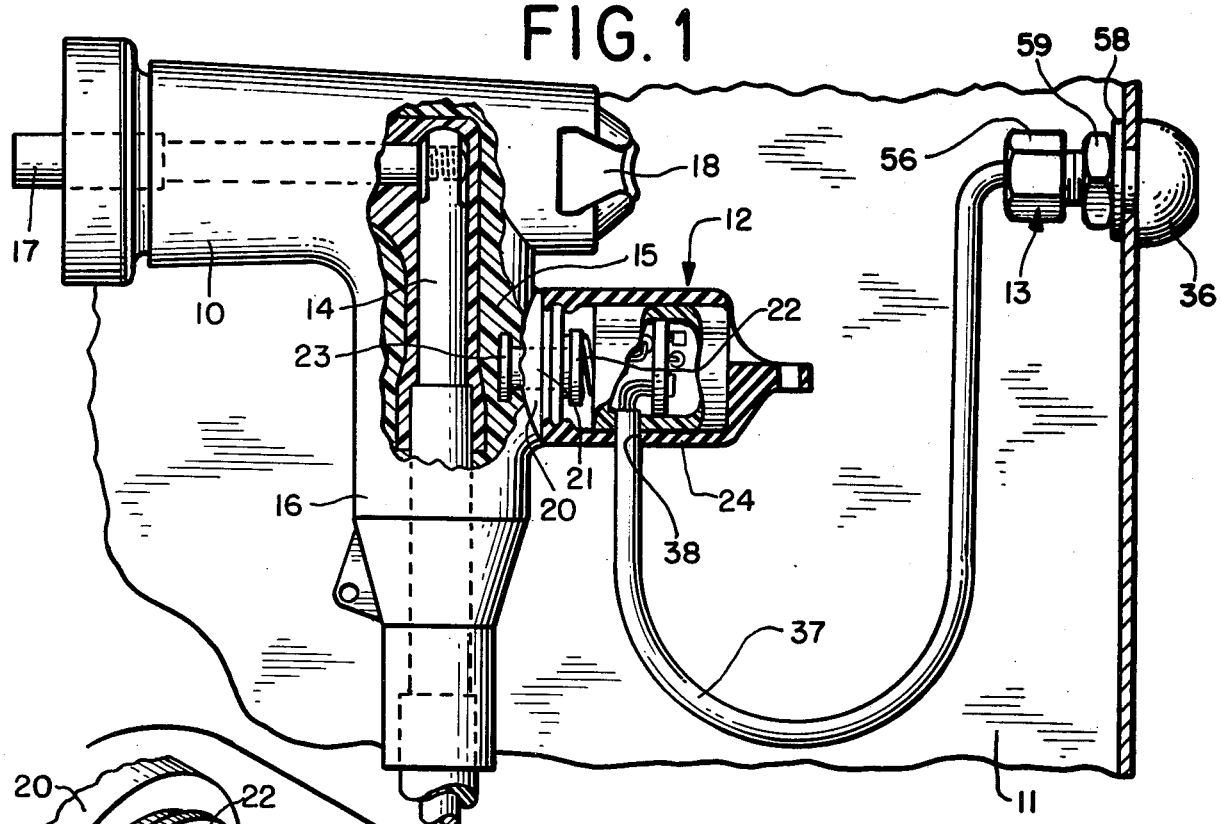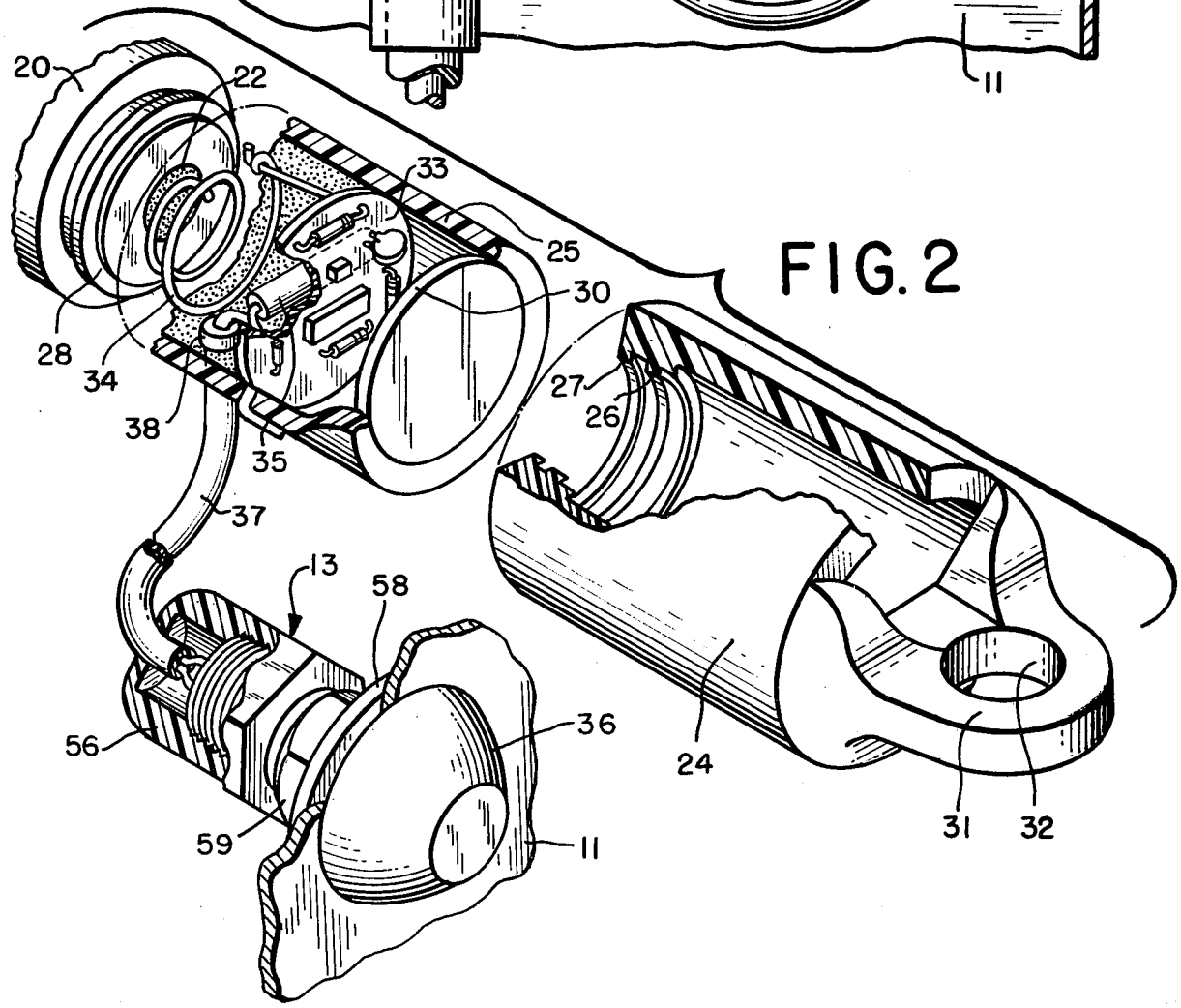

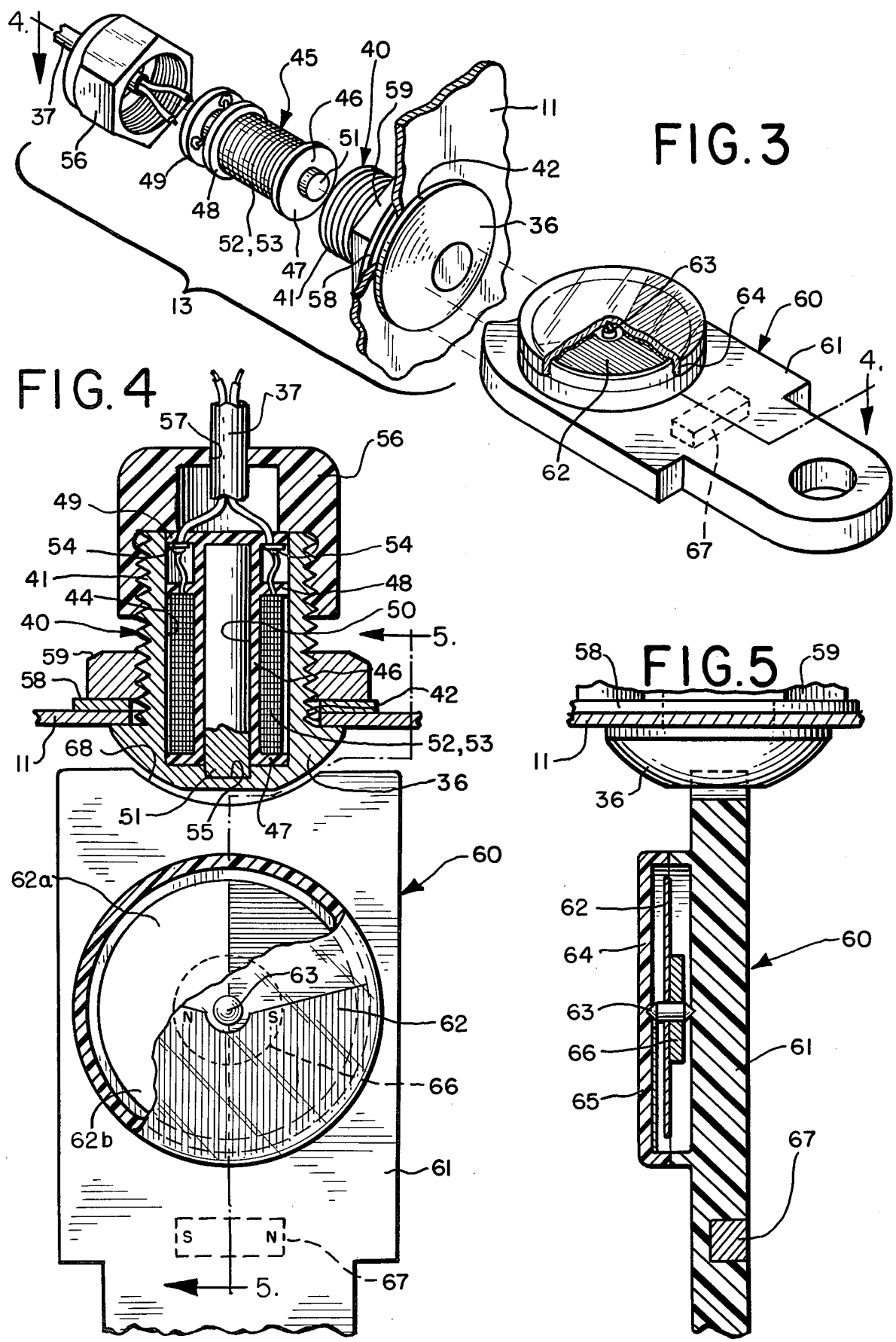

FAULT INDICATOR HAVING A REMOTE TEST POINT AT WHICH FAULT OCCURRENCE IS INDICATED BY CHANGE IN MAGNETIC STATE

This is a continuation of application Ser. No. 103,042, filed Dec. 13, 1979, now abandoned.

BACKGROUND OF THE INVENTION

The present invention relates generally to current sensing devices for electrical systems, and more particularly to automatically resettable alternating current fault indicators for use within closed housings such as are utilized to enclose pad-mounted components in an underground power distribution system.

Various types of fault indicators have been constructed for detecting electrical faults in power distribution systems, including clamp-on type fault indicators, which clamp directly over cables in the systems, and test-point type fault indicators, which are mounted over test points in cables or associated connectors of the systems. Such fault indicators may be either of the manually reset type, wherein it is necessary that the indicators be physically reset, or of the self-resetting type, wherein a fault indication is reset upon restoration of line current. Examples of such fault indicators are found in products manufactured by E. O. Schweitzer Manufacturing Co. of Mundelein, Ill., in U.S. Pat. Nos. 3,676,740, 3,906,477 and 4,063,171 of the present inventor, and in the copending application of the present inventor, Ser. No. 958,103, filed Nov. 6, 1978.

Detection of fault currents by self-resetting fault indicators is often accomplished by means of a reed switch located within the indicator housing having contacts in close proximity to the conductor being monitored. Upon occurrence of an abnormally high fault-associated magnetic field around the conductor, the contacts close and actuate circuitry which magnetizes an internal pole piece to position to a trip position a target indicator visible from the exterior of the indicator. Upon restoration of current in the conductor another circuit is actuated to reposition the target indicator to a reset or non-fault indicating position.

With the increased use of underground electrical distribution system wherein primary and secondary feeder cables are directly buried in the ground, and are brought to the surface only for connection to pad mounted distribution transformers or other system components, the need has arisen for fault detectors suitable for mounting within the above-ground metal enclosures typically utilized to house and protect such components. Preferably, such fault indicators should be sufficiently compact so as to not interfere with other components in the enclosures, and should not compromise the security provided to the power system components by the enclosures against vandalism or theft.

It has been found that those fault indicators which provide a visible indication of fault occurrence, such as by rotation of an indicator flag or by the flashing of a light, and therefore require that a window or other opening by provided in the housing, tent to attract the interest of vandals, and to provide encouragement for those seeking access to the enclosure, increasing the possibility of damage to the enclosure from attempted entry.

The present application is directed to a fault indicator for use within an equipment enclosure wherein fault indications are provided at a magnetic test point external to the enclosure, thereby obviating the need for visual contact with the interior of the enclosure.

Accordingly, it is a general object of the present invention to provide a new and improved fault indicator for use in conjunction with enclosed pad-mounted power distribution system components.

It is a more specific object of the present invention to provide a compact and economical fault indicator which provides an indication of circuit status at a remote magnetic test point.

SUMMARY OF THE INVENTION

In accordance with these and other objects of the present invention, a fault indicator for providing on the exterior of an electrical equipment enclosure an indication of the occurrence of an electrical fault current in an electrical conductor within the enclosure, comprises status indicating means including a magnetic test point on the exterior of the enclosure. The test point is magnetizable to first and second magnetic polarities to indicate the status of the conductor. Circuit means within the enclosure operatively associated with the conductor and responsive to the current level therein, are provided for conditioning the magnetic test point to the first polarity upon occurrence of a fault current in the conductor, and to the second polarity upon restoration of current through the conductor.

The invention is further directed to a circuit condition indicating tool operable in conjunction with a fault indicator having a remote magnetic test point indicative of circuit condition as defined above.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is an elevational view, partly in section, illustrating a fault indicator constructed in accordance with the invention having a test point-mounted circuit module and a remote magnetic indicator module for use within an equipment enclosure in accordance with the invention.

FIG. 2 is an exploded perspective view of the principal components of the fault indicator with the circuit and indicator modules thereof partially in section to illustrate the internal construction of these components.

FIG. 3 is an exploded perspective view of the remote indicator module of the fault indicator, and of the circuit condition indicator tool constructed in accordance with the invention.

FIG. 4 is an enlarged cross-sectional view of the indicator module and circuit condition indicator tool taken along line 4—4 of FIG. 3.

FIG. 5 is a cross-sectional view of the indicator module and circuit condition indicator tool taken along line 5—5 of FIG. 4.

DESCRIPTION OF THE PREFERRED EMBODIMENT

Figure 6A:
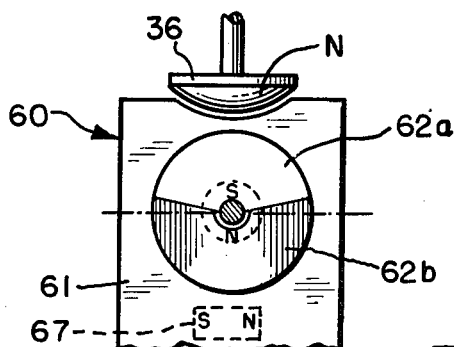
FIG. 6(A) is a diagramatic view of the magnetic test point and circuit condition indicating tool of the fault indicator system in a reset state.

Referring to the drawings, and particularly to FIG. 1, the fault indicator system of the invention is shown in conjunction with a plug-in elbow connector 10 of conventional construction for use in high voltage underground alternating current power systems. The elbow connector is installed on a transformer or other component of the system (not shown) which in accordance with conventional practice in such underground systems is pad-mounted above ground and enclosed within a tamper-proof weather-sealed protective housing 11. The purpose of the fault indicator system is to provide at the exterior of the housing an indication of the occurrence of a fault within the system, and to this end the fault indicator system includes a circuit module 12 fastened to a test point on the elbow connector, and an indicator module 13 providing an external magnetic test point by which the circuit status can be determined.

As shown, the elbow connector 10 includes generally an axial conductor 14 extending through an electrically insulating body portion 15 encased in an electrically-conductive rubber sheath 16, the sheath being grounded in accordance with conventional practice. An electrically conductive contact member 17 threaded at one end into an aperture in the end of conductor 14, extends from conductor 14 to mate with a complementary contact on the device. An arcuate member 18 having ends anchored in the conductive sheath 16 extends from the connector to receive the hooked end of the lineman's tool commonly used to remove plug-in connectors from such devices.

With reference also to FIG. 2, elbow connector 10 includes a test point terminal 20 on which the circuit module 12 is attached. In accordance with conventional practice, the test point connector is formed by a cylindrical portion of the insulating body portion 15 which projects radially through the conductive sheath 16. Embedded in the test point terminal 20 is an electrically conductive contact 21 having an annular outer flange portion 22 which is exposed at the outer end of the terminal to provide an electrical connection to the contact, and an inner portion 23 in close proximity to conductor 14 to capacitively couple circuitry in circuit module 12 to the conductor.

Circuit module 12 is provided with a housing comprising an electrically-conductive semi-flexible rubber outer shell 24 which is generally cylindrical in form and open at one end for snap-over mounting to test point terminal 20. A correspondingly sized cylindrical housing 25 formed of plastic or other electrically non-conductive material is fitted within shell 24 to receive the electrical components of circuit module 12. Housing 25 may be held in position by an annular flange 26 on the inside surface of the shell. An additional annular flange 27 may be provided for engaging an annular flange 28 on test point 20 to secure the circuit module to the test point. The other end of cylindrical housing 25 is closed by means of an end cap 30 which is sonically welded to the housing.

When circuit module 12 is installed on test point terminal 20, the annular end flange 27 of shell 24 snaps over flange 28 to provide a tight weather-proof engagement between the two elements. The annular end flange 26 bears against the end of housing 25 to maintain the housing seated within shell 24. The outer surface of flange 27 engages the connector sheath 14 to make electrical contact therewith and thereby ground the shell. At the closed end of shell 24 a tab portion 31 having an aperture 32 therethrough is provided to facilitate removal of the circuit module from the test point with a conventional hooked lineman's tool (not shown).

To provide means for mounting the individual components of circuit module 12, a disc-shaped insulator board 33 is mounted within housing 25 perpendicular to the axis of the housing and in a location intermediate the ends thereof. Electrical contact is established between the electrical components mounted on circuit board 33 and test point contact 22 by means of a helical spring 34. To provide for sensing of a fault current in conductor 14, circuit module 12 includes a reed switch 35 mounted to the rear (as seen in FIG. 2) surface of circuit board 33. As will be seen presently, upon occurrence of a fault this reed switch closes to energize circuitry in module 12 which conditions indicator 13 to a fault indicating magnetic state.

Indicator module 13, which includes a magnetic test point 36 on the exterior surface of enclosure 11, is connected to circuit module 12 by a multiple conductor cable 37. Cable 37 enters housing 25 through an aperture 38 in the housing wall to provide for convenient connection between the conductors of the cable and the individual components mounted on circuit board 33.

Referring to FIG. 3, the remote magnetic indicator module 13 comprises a bolt-shaped housing 40 formed of an aluminum alloy having low magnetic resistance and retention characteristics. The housing includes a threaded shank portion 41 which extends through an aperture 42 in the wall of enclosure. A rounded head portion of relatively larger diameter on the exterior end of the body member forms the magnetic test point 36 of the indicator modules and prevents the housing from being pulled back into the enclosure through the aperture. The shank portion of housing 40 includes a bore-shaped recess 44 which extends along essentially the entire length of the housing, but does not extend through the head portion 36.

To provide means for inducing a magnetic state at magnetic test point 36, indicator module 13 includes within recess 44 a magnetic core assembly 45. The best seen in FIG. 4, core assembly 45 includes a generally cylindrical bobbin 46 formed of a non-conductive non-magnetic material such as plastic. The bobbin includes a single annular flange portion 47 at its forward end, a pair of parallel-spaced annular flange portions 48 and 49 at its other end, and an axially-aligned bore-shaped recess 50. A rod-shaped magnetic core member 51 formed of a high magnetic retention characteristic material such as 3½ chrome magnet steel is slidably received within recess 50 such that the forward end of the core member is brought into abutting engagement with the closed end of the recess adjacent head portion 36. An additional bore-shaped recess 55 of reduced diameter at the end of recess 44 may be provided to receive the end of the core member. To provide means for magnetizing core member 51, bobbin assembly 45 includes a trip winding 52 and a reset winding 53 wound on the bobbin between flange portions 47 and 48. These windings are connected to individual conductors of cable 37 at connection points 54 on flange portion 49 to facilitate energization by the circuitry of circuit module 12.

Core assembly 45 is retained in position by an end cap 56 threaded over the end of shank portion 41. This end cap, which may be formed of a plastic material, includes an aperture 57 through which cable 37 is snuggly received. The entire indicator module 13 may be secured in position on the enclosure wall by means of a washer 58 and nut 59 threaded over the shank portion of housing 40.

Figure 6B:
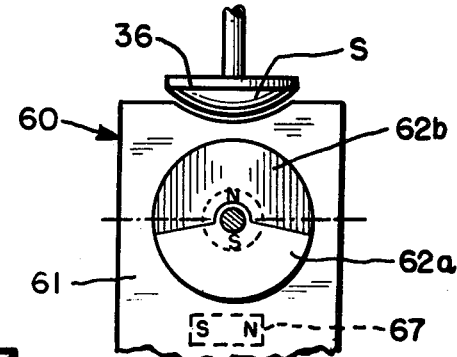
FIG. 6(B) is a diagramatic view similar to FIG. 6(A) showing the fault indicator system in a tripped state.

On the occurrence of a fault current in conductor 14, which may, for example, exceed 400 amperes, the magnetic test point 36 is magnetized to the magnetic polarity shown in FIG. 6(B) by momentary energization of trip winding 52 on bobbin assembly 45. Magnetic test point 36 remains in this fault-indicating magnetic polarity until magnetic core 51 is subsequently remagnetized to the reset-indicating magnetic polarity shown in FIG. 6(A).

To provide a visible indication to service personnel of the magnetic polarity of magnetic test point 36, the fault indicator includes a hand-held circuit status indicator tool 60. As shown in FIGS. 3-5, indicator tool 60 includes a generally flat body 61 having an apertured handle portion at one end thereof. Adjacent the other end of the body, the indicator tool includes magnetic sensing means in the form of a rotatably mounted indicator disc 62. The face of disc 62 is divided into a reset-indicating white colored segment 62(A) and a fault-indicating red colored segment 62(B). A raised transparent plastic cover 64 extends over the disc to form a sealed compartment within which the disc is free to turn. An opaque mask 65 on the inside surface of cover 64 allows only the top portion (as viewed in FIG. 4) of the disc to be visible to the user.

To render the position of disc 62 dependent on the magnetic polarity of magnetic test point 36, the disc includes about its pivot point an annular-shaped permanent magnet 66 having magnetic poles as shown in FIG. 4. In the absence of an external magnetic influence, such as presented by magnetic test point 36, disc 62 is biased to the intermediate non-indicating position shown wherein both the white and red colored segments 62(A) and 62(B) are visible in generally equal proportions by means of a permanent magnet 67 mounted on base 61 along one edge of the disc. The poles of this magnet attract the poles of opposite polarity on magnet 66 with the result that the indicator rotates to and remains in the intermediate position.

When circuit status indicator tool 60 is placed adjacent to magnetic test point 36, as shown in FIGS. 4 and 5, the stronger magnetic field provided by the magnetized core member 51 is sufficient to overcome the biasing force of magnet 67. In the event that core 51 is in a reset state, the external magnetic field applied by magnet 51 rotates disc 62 in its reset-indicating position, as shown in FIG. 4. However, in the event core 51 has been magnetized to a fault-indicating magnetic polarity, the magnetic force exerted on magnet 66 is sufficient to overcome bias magnet 67 and cause the indicator disc 62 to rotate to and remain in a fault-indicating position while the indicator tool is held engaged to magnetic test point 36. A recess 68 may be provided on the end of the circuit status indicator tool body 61 to assist in alignment of the indicator with respect to the magnetic test point.

The indications provided by the hand held circuit status indicator 60 for reset and fault conditions are shown in FIGS. 6(A) and 6(B). In the reset condition of FIG. 6(A), it will be noted that only the white portion 62(A) of indicator disc 62 is visible to the user, the magnetic polarity of magnetic test point 36 serving to reinforce the bias effort of magnet 67. In contrast, in the fault condition of FIG. 6(B), the polarity of magnetic test point 36 is such that indicator disc 62 is rotated and the user sees only the red colored portion 62(B) of the disc.

Figure 7:
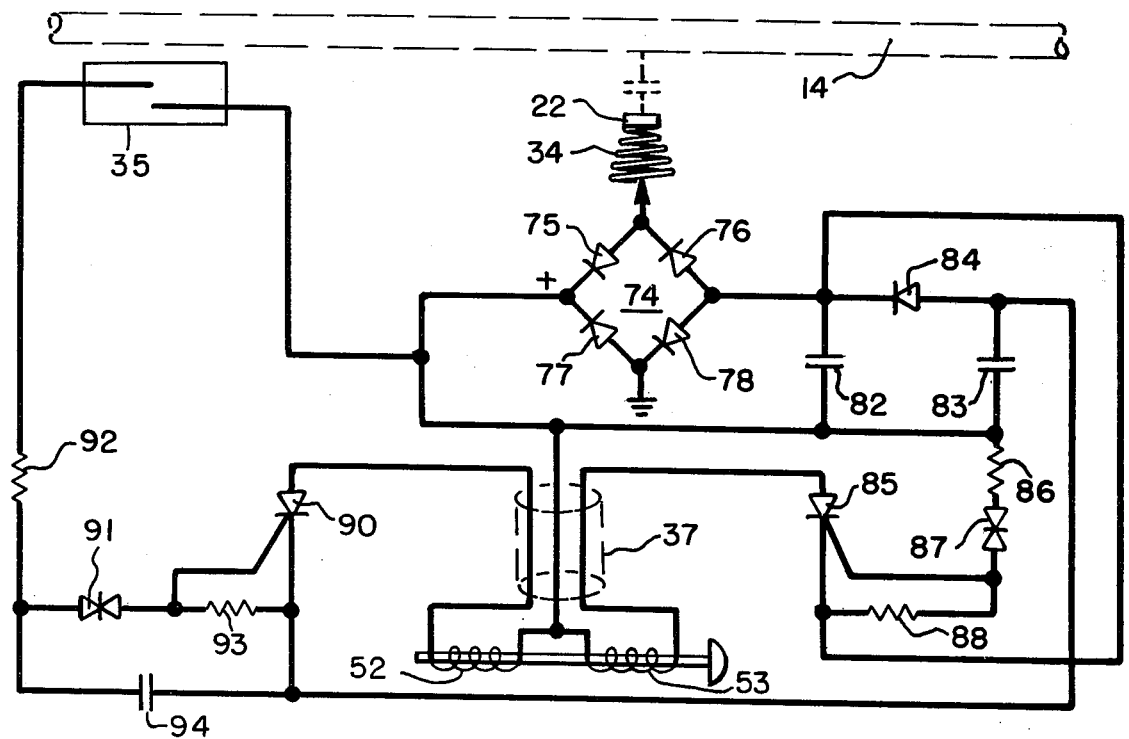
FIG. 7 is an electrical schematic diagram of the fault indicator.

Energization of winding 52 upon occurrence of a fault current in conductor 14, and energization of winding 53 upon restoration of current in conductor 14 following a fault, is accomplished by means of externally-powered circuitry contained within circuit module 12. Referring to the schematic diagram shown in FIG. 7, the windings 52 and 53 of indicator module 13 are connected end-to-end for independent energization upon occurrence of fault end reset conditions, respectively. Operating power for these windings is obtained by means of a bridge rectifier network 74 consisting of diodes 75-78. One input terminal of this network, formed at the juncture of the anode of diode 75 and the cathode of diode 76, is connected through the helical spring 34 to test point contact 22. The other input terminal, formed at the anode of diode 77 and the cathode of diode 78, is connected to ground through the electrically conductive sheath 24 of the circuit module housing. With this arrangement, high voltage alternating current carried in conductor 14 is capacitively coupled to the bridge rectifier network, resulting in the production of a pulsating unidirectional current at the output terminals of the network.

The positive polarity output terminal of the bridge rectifier network, formed at the cathodes of diodes 75 and 77, is connected to one contact of reed switch 35, to the commonly-connected end terminals of windings 52 and 53, and to respective terminals of capacitors 82 and 83. The negative polarity output terminal of the bridge rectifier network, formed at the juncture of the anodes of diodes 76 and 78, is connected directly to the remaining terminal of capacitor 82, and through a forward-biased diode 84 to the remaining terminal of capacitor 83. With the arrangement, capacitors 82 and 83 are charged by the pulsating unidirectional current developed by bridge rectifier network 74 during normal current flow in conductor 14.

To provide for periodic energization of reset winding 53 during normal current flow in conductor 14, the remaining end terminal of winding 53 is connected through a silicon controlled rectifier (SCR) 85 to the negative polarity terminal of capacitor 82. Periodic conduction through SCR 85 is obtained by connecting the gate electrode of that device to the positive polarity output terminal of bridge rectifier 74 through a resistor 86 and a bilateral diode 87, and to the cathode of SCR 85 is periodically triggered into conduction when the the voltage developed across bilateral diode 87 as a result of capacitor 82 being charged by bridge rectifier 74 reaches the threshold level of the bilateral diode.

In operation, under normal current flow conditions, the voltage developed across capacitor 82 as the capacitor is charged by bridge rectifier network 74 progressively increases with time, until the threshold breakdown voltage of bilateral diode 87 is reached, at which time SCR 85 is triggered and capacitor 82 discharges through winding 73. Diode 84 prevents capacitor 83 from being discharged through SCR 85 and reset winding 53, leaving the capacitor available for energizing trip winding 52 in response to a fault condition. In practice, the breakdown voltage of bilateral diode 87 may be in the order of 34 volts, and the time required for capacitor 82 to reach this threshold level with a typical voltage level of 4,400 volts on conductor 14 may be approximately 2 minutes. In any case, the voltage level within conductor 14 is not critical to the operation of the reset circuit, and has only the effect of changing the repetition rate of the reset cycle.

Trip winding 52 is energized upon occurrence of a fault current in conductor 14 by discharge of capacitor 83 through a second silicon controlled rectifier 90. Conduction is established through SCR 90 by closure of the contacts of reed switch 35, which is positioned within housing 25 in close proximity to conductor 14 such that the alternating magnetic field produced in the vicinity of conductor 14 upon generation of a fault current is sufficient to close the contacts of the reed switch. The gate electrode of SCR 90 is connected through a bilateral diode 91 and a resistor 92 to the remaining contact of reed switch 35, and through a resistor 93 to the SCR cathode. The juncture of resistor 92 and bilateral diode 91 is connected by a capacitor 94 to capacitor 83.

Upon occurrence of a fault current in conductor 14, the positive polarity output terminal of bridge rectifier network 74 is connected through the closed contacts of reed switch 35 and the circuit comprising resistor 92, bilateral diode 91, resistor 93 and capacitor 94 to the gate electrode of SCR 90, causing that device to be rendered conductive following a predetermined time delay. At this time capacitors 82 and 83 are caused to discharge through SCR 90 and energize winding 72. The resulting magnetic flux in magnetic core 51 reversed the magnetic polarity of the core and causes magnetic test point 36 to assume the magnetic polarity indicative of a fault state.

To preclude the possibility of windings 52 and 53 being simultaneously actuated by simultaneous conduction through SCR 90 and SCR 85, a predetermined time delay in conduction through SCR 90 is provided following occurrence of a fault current in conductor 11. This is accomplished by resistor 92 and capacitor 94 which together form an RC time constant network in the gate electrode of SCR 90. Upon closure of the contacts of reed switch 35 is it necessary that capacitor 94 charge through resistor 92 to the threshold voltage of bilateral diode 91 before sufficient gate electrode current is supplied to SCR 90 to initiate conduction in that device.

The actual time delay provided is determined by the resistance of resistor 92, the capacitance of capacitor 94, the threshold voltage of bilateral diode 91, and the voltage level developed across capacitor 83, and is designed to insure that should a fault occur simultaneously with the periodic energization of winding 53, capacitor 82 with have completely discharged through the winding prior to winding 52 being energized to signal the fault. In practice, with a 36 volt voltage level across capacitor 83 and a 20 volt threshold voltage level for bilateral diode 91, the time delay may be in order of 180 microseconds, with a resistor 92 of 1,800 ohms and a capacitor 94 of 0.1 microfarads.

Figure 8:
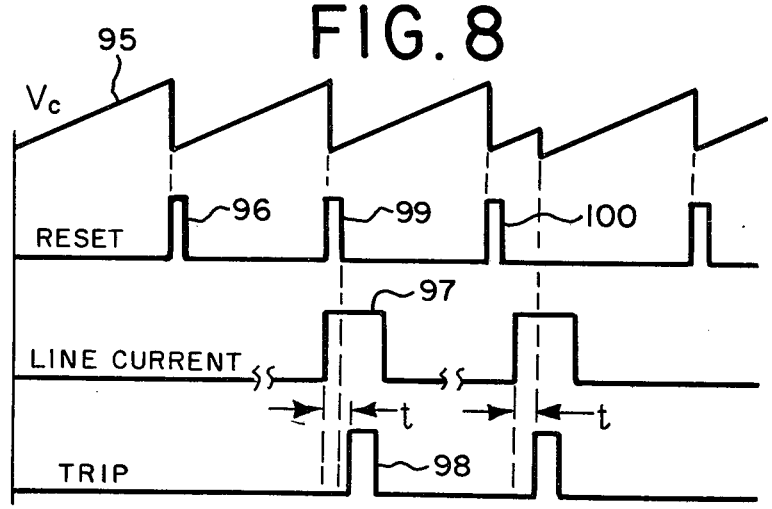
FIG. 8 is a depiction of certain time, voltage and current relationships of the fault indicator useful in understanding the operation thereof.

The time delay relationship can be seen by referring to the waveforms illustrated in FIG. 8. Under normal line current conditions it is seen that the voltage VCC developed across capacitor 82 as depicted by waveform 95 progressively increases until the threshold level of bilateral diode 92 is reached, at which time SCR 85 is rendered conductive and a reset current depicted by waveform 96 is repetively caused to flow through reset winding 53. Upon occurrence of a fault current in conductor 14, as depicted by waveform 97, trip winding 72 is energized after a delay period "t", as shown by waveform 98. Should the fault current occur simultaneously with the reset pulse as shown by waveform 99, capacitor 82 will have completely discharged through winding 53 prior to winding 52 being energized, as a result of the time delay period "t". If it were not for this delay period, windings 52 and 53 could be simultaneously energized, resulting in the production of opposing magnetic fields in core 51 and raising the possibility of the core not assuming a fault-indicative magnetic polarity. Typically, the reset current pulses supplied to windings 52 and 53 have a duration of approximately 20 microseconds and fault currents existing in conductor 14 have a duration of approximately ¼ cycle, or approximately 4 milliseconds in a 60 hertz system.

Should a fault occur before the reset pulse, as illustrated by waveform 100, the then occurring reset cycle will be interrupted by discharge of capacitor 82 through diode 84 and SCR 90 so that no possibility exists of a reset pulse occurring simultaneously with the ensuing delayed reset pulse. Upon discharge of capacitors 82 and 83 through winding 52, the reset cycle begins anew as SCR 90 again becomes nonconductive.

A fault indicator has been shown and described which allows the condition of a circuit contained within a weather-sealed equipment enclosure to be determined on the exterior of the enclosure without the necessity of visual contact with components inside the enclosure, or the need for visual indicators such as lights or mechanical flags on the outside of the enclosure which might invite vandalism. All that is seen on the outside of the housing is the magnetic test-point, having the appearance of a rounded bolt head. To determine circuit status it is merely necessary to hold the circuit status indicator tool up to the test point and observe the rotation of its indicator disc. Failure of the disc to rotate indicates a failure of the fault indicator or an insufficient magnetic coupling to the magnetic test point.

The fault indicator and circuit status indicator tool are simple in design and construction, and may be economically constructed to accommodate a wide range of circuit conditions. For example, the fault indicator could be constructed without reset winding 53 and its associated circuitry where automatic reset is not required, allowing the test point to remain in its trip-indicating magnetic state even after current flow has resumed. Also, it would be possible to utilize other circuits, such as circuits relying on inductive coupling to the power system conductor, or circuits relying on a battery energizing the trip winding, for establishing the trip-indicating magnetic state at the test point.

While a particular embodiment of the invention has been shown and described, it will be obvious to those skilled in the art that changes and modifications may be made therein without departing from the invention in its broader aspects, and therefore, the aim in the appended claims is to cover all such changes and modifications as fall within the true spirit and scope of the invention.

I claim:

1. A fault indicator for use in conjunction with a removable magnetically actuated circuit status indicator for providing on the exterior surface of an electrical equipment enclosure a magnetic flux for actuating the indicator following the occurrence of a fault current in an electrical conductor within the enclosure, said indicator comprising, in combination:

status indicating means including a test point member extending through a wall of the enclosure and forming on the exterior surface thereof a tamper-resistant magnetic test point; and fault responsive means within the enclosure responsive to the current level in the conductor for producing at said magnetic test point the magnetic flux for actuating the indicator upon the occurrence of a fault current in the conductor.

2. A fault indicator as defined in claim 1 wherein said fault detection means condition said test point member to one magnetic polarity upon occurrence of a fault current, and to the opposite magnetic polarity upon restoration of current in the conductor.

3. A fault indicator as defined in claim 1 wherein said test point member is formed of relatively non-magnetic material, and said status indicating means include a magnetic core member of relatively high magnetic retention capability in magnetic communication with said test point member.

4. A fault indicator as defined in claim 1 wherein said test point member comprises a hollow housing having an interior portion within the enclosure and an exterior portion exposed to the exterior of the enclosure, said interior and exterior portions being connected through an aperture in the enclosure.

5. A fault indicator as defined in claim 4 wherein said test point member is formed of a relatively non-magnetic material, and said status indicating means include a magnetic core member of relatively high magnetic retention capability within said housing.

6. A fault indicator as defined in claim 5 wherein said magnetic core member is at least partially disposed in said exterior portion of said housing.

7. A fault indicator as defined in claim 5 wherein said fault detection means include a magnetic winding in magnetic communication with said magnetic core member, and said magnetic winding is at least partially disposed within said interior portion of said housing.

8. A fault detector as defined in claim 4 wherein said housing is formed of a non-magnetic aluminum alloy.

9. A fault indicator as defined in claim 4 wherein said interior portion of said housing includes a body portion of relatively lesser diameter extending through said aperture, and said exterior portion includes a head portion of relatively greater diameter on the exterior surface of the enclosure.

10. A fault indicator as defined in claim 9 wherein said housing is formed of a non-magnetic material, and wherein said status indicating means include a magnetic core member of relatively high magnetic retention capability at least partially disposed within said body portion.

11. A fault indicator as defined in claim 10 wherein said fault detection means include a magnetic winding in magnetic communication with said core member, and said magnetic winding is at least partially disposed within said body portion.

12. A fault indicator as defined in claim 11 wherein said body portion is externally threaded, and wherein said test point member is fastened to the enclosure by a fastening member threaded over said body portion.

13. A fault indicator for use in conjunction with a removable magnetically actuated circuit status indicator for providing on the exterior of an electrical equipment enclosure a magnetic flux for actuating the indicator following the occurrence of a fault current in an electrical conductor within the enclosure, said indicator comprising, in combination:

status indicating means including a test point member adapted to extend through an aperture in the enclosure and to define a tamper-resistant magnetic test point generally contiguous with the exterior surface of the enclosure, and a magnetic core member of relatively high magnetic retention capability in magnetic communication with said test point member; and fault responsive circuit means within the enclosure responsive to the current level in the conductor and including a magnetic winding in magnetic communication with said core member for magnetizing said core member to provide the magnetic flux for actuating the indicator at said magnetic test point upon occurrence of a fault current in the conductor.

14. A fault indicator as defined in claim 13 wherein said test point member includes a body portion of relatively lesser diameter extending through said aperture, and a head portion of relatively greater diameter on the exterior surface of the enclosure.

15. A fault indicator as defined in claim 14 wherein said head portion is hollow, and wherein said magnetic core member is at least partially disposed within said head portion.

16. A fault indicator as defined in claim 13 wherein said test point member is formed of an aluminum alloy.

17. A fault indicator system for providing at the exterior of an electrical equipment enclosure an indication of the occurrence of a fault current in an electrical conductor within the enclosure, said indicator system comprising, in combination:

status indicating means including a test point member at least partially exposed to the exterior of the enclosure so as to define a tamper-resistant magnetic test point contiguous with the exterior surface of the enclosure;

fault responsive means within said enclosure responsive to the current level in the conductor for producing at said test point a fault-indicating magnetic field upon occurrence of a fault current in the conductor; and removable indicator means user-engagable to said magnetic test point and responsive to the fault-indicating magnetic field at said test point for indicating to the user the status of the conductor.

18. A fault indicator system as defined in claim 17 wherein said fault detection means condition said test point to one magnetic polarity upon occurrence of a fault current in the conductor, and to the opposite magnetic polarity upon restoration of current in the conductor.

19. A fault indicator system as defined in claim 17 wherein said test point member is formed of non-magnetic material, and said status indicating means include a magnetic core member of relatively high magnetic retention capability in magnetic communication with said test point member.

20. A fault indicator system as defined in claim 17 wherein said test point member comprises a hollow housing having an interior portion within the enclosure and an exterior portion exposed to the exterior of the enclosure, said interior and exterior portions being connected through an aperture in the enclosure.

21. A fault indicator system as defined in claim 20 wherein said test point member is formed of a relatively non-magnetic material, and said status indicating means include a magnetic core member of relatively high magnetic retention capability within said housing.

22. A fault indicator system as defined in claim 21 wherein said magnetic core member is at least partially disposed in said exterior portion of said housing.

23. A fault indicator system as defined in claim 21 wherein said fault detection means includes a magnetic winding in magnetic communication with said core member, and said magnetic winding is at least partially disposed within said interior portion of said housing.

24. A fault indicator system as defined in claim 20 wherein said housing is formed of a non-magnetic aluminum alloy.

25. A fault indicator system as defined in claim 20 wherein said interior portion of said housing includes a body portion of relatively lesser diameter extending through said aperture, and said exterior portion of said housing includes a head portion of relatively greater diameter on the exterior surface of the enclosure.

26. A fault indicator system as defined in claim 25 wherein said housing is formed of a non-magnetic material, and wherein said status indicating means include a magnetic core member of relatively high magnetic retention capability at least partially disposed within said body portion.

27. A fault indicator system as defined in claim 25 wherein fault detection means include a magnetic winding in magnetic communication with said test point, and said magnetic winding is at least partially disposed within said body portion.

28. A fault indicator system as defined in claim 26 wherein said body portion is externally threaded, and wherein said test point member is fastened to the enclosure by a fastening member threaded over said body portion.

29. A fault indicator system as defined in claim 17 wherein said magnetic test point comprises a raised surface on the exterior surface of the enclosure, and wherein said circuit status indicator means include indexing means for engaging said magnetic test point to assist in positioning said indicator in magnetic communication with said test point.

30. A fault indicator as defined in claim 25 wherein said exterior portion is in the form of a rounded bolt head on the surface of the enclosure.

31. A fault indicator system for providing at the exterior of an electrical equipment enclosure an indication of the occurrence of a fault current in an electrical conductor within the enclosure, said indicator system comprising, in combination:
    status indicating means including a non-magnetic test point member extending through an aperture in the enclosure so as to define a tamper-resistant magnetic test point contiguous with the exterior surface of the enclosure, and a core member of relatively high magnetic retention in magnetic communication with said test point member for establishing a magnetic field in said test point member;
    fault responsive circuit means within the enclosure responsive to the current level in the conductor and including a magnetic winding in magnetic communication with said core member for magnetizing said core member to provide the fault indicative magnetic field at said test point upon occurrence of a fault current in the conductor; and
    removable indicator means user-engagable to said magnetic test point and responsive to the fault indicative magnetic field for indicating to the user the status of the conductor.

32. A fault indicator system as defined in claim 31 wherein said test point member includes a body portion of relatively lesser diameter extending through said aperture, and a head portion of relatively greater diameter on the exterior surface of the enclosure.

33. A fault indicator system as defined in claim 32 wherein said head portion is hollow, and wherein said magnetic core member is at least partially disposed within said head portion.

34. A fault indicator system as defined in claim 31 wherein said test point member is formed of an aluminum alloy.

35. A removable circuit indicator for use in conjunction with a fault indicator of the type which includes a test point member forming a magnetic test point on the exterior of an enclosure, the magnetic test point having a magnetic state of one polarity indicative of the occurrence of a fault current in the conductor, and a magnetic state of the opposite polarity indicative of a normal reset condition, said indicator comprising, in combination:
    a base member adapted for user-positioning in close proximity to said magnetic test point;
    a user-viewable flag member mounted on said base member for movement between a trip-indicating position and a reset indicating position; and
    means including a permanent magnet mounted for rotation with said flag member for positioning said flag member in said trip-indicating position in response to a magnetic state of said one polarity on said test point member, and in said reset-indicating position in response to a magnetic state of said opposite polarity on said test point member, when said base member is positioned to bring said flag member into magnetic communication with said magnetic test point.

36. A circuit status indicator tool as defined in claim 35 including biasing means for biasing said flag member to an intermediate non-indicating position when said flag member is not in magnetic communication with said magnetic test point.

37. A circuit status indicator tool as defined in claim 36 wherein said biasing means comprise a bias magnet mounted on said base member in magnetic communication with said permanent magnet on said flag member.

38. A circuit status indicator tool as defined in claim 35 wherein said flag member comprises a disc rotatably mounted to said base member.

39. A circuit status indicator tool as defined in claim 35 wherein said base member includes indexing means for engaging said test point member whereby said flag member is positioned in close proximity to said test point member.

40. A fault indicator for use in conjunction with a removable magnetically actuated circuit status indicator for providing on the exterior of an electrical equipment enclosure having an aperture a magnetic state for actuating the indicator following the occurrence of a fault current in an electrical conductor within the enclosure, said indicator comprising, in combination:
    a magnetic test point assembly including a hollow relatively non-magnetic test point member having a shank portion of relatively lesser diameter extending through the aperture, and a head portion of relatively larger diameter exposed on the exterior surface of the housing so as to form a tamper-resistant magnetic test point contiguous with the surface of the enclosure;

means including a core member of relatively high magnetic retention capability disposed at least partially within said test point member for magnetizing said core member to a selected magnetic state; and fault detection circuit means within said enclosure responsive to the current level in the conductor and including a magnetic winding for conditioning said core member and said test point to a magnetic state of one magnetic polarity upon occurrence of a fault current in the conductor, and to a magnetic state of opposite magnetic polarity upon restoration of current through the conductor.

41. A fault indicator as defined in claim 40 wherein said core member is substantially cylindrical in form, and said magnetic winding is disposed on a bobbin concentric with said core member.

42. A fault indicator as defined in claim 40 wherein said shank portion is externally threaded, and wherein said magnetic test point assembly is mounted to the enclosure by means of a fastener threaded over said shank portion.

43. A fault indicator system for providing on the exterior of an electrical equipment enclosure having a test point aperture a magnetic state indicative of the occurrence of a fault current in an electrical conductor within the enclosure, said indicator system comprising, in combination:

a magnetic test point assembly including a hollow relatively non-magnetic test point member having a shank portion of relatively lesser diameter extending through said aperture, and a head portion of relatively larger diameter exposed on the exterior surface of the housing so as to form a tamper-resistant magnetic test point contiguous with the surface of the enclosure;

means including a core member of relatively high magnetic retention capability disposed at least partially within said head portion for providing a magnetic state at said magnetic test point;

means including at least one magnetic winding at least partially disposed within said test point member for magnetizing said core portion to provide a selected magnetic state;

fault detector circuit means within said enclosure responsive to the current level in the conductor and including said magnetic winding for magnetizing said core member to produce a magnetic state at said test point of one magnetic polarity upon occurrence of a fault current in the conductor, and a magnetic state of the opposite magnetic polarity upon restoration of current through the conductor; and a removable circuit status indicator tool engagable to said head portion and responsive to the magnetic field at said magnetic test point for visually indicating the status of the conductor.

44. A fault indicator system as defined in claim 43 wherein said core member is substantially cylindrical in form, and said magnetic winding is disposed on a bobbin concentric with said core member.

45. A fault indicator system as defined in claim 43 wherein said shank portion is externally threaded, and wherein said magnetic test point assembly is mounted to the enclosure by means of a fastener threaded over said shank portion.

46. A fault indicator for use in conjunction with a removable magnetically-actuated circuit status indicator for providing on the exterior surface of an electrical equipment enclosure a magnetic flux for actuating the indicator following the occurrence of a fault current in an electrical conductor within the enclosure, said indicator comprising, in combination:

status indicating means comprising a magnetic circuit serially including a magnetizable core and a magnetic gap for producing at a test point on the exterior of the enclosure the magnetic flux; and fault responsive means for magnetizing said magnetic core upon the occurrence of a fault current to produce the magnetic flux at said test point.

* * * * *

UNITED STATES PATENT AND TRADEMARK OFFICE
CERTIFICATE OF CORRECTION

PATENT NO. : 4,458,198
DATED : July 3, 1984
INVENTOR(S) : Edmund O. Schweitzer, Jr.

It is certified that error appears in the above-identified patent and that said Letters Patent are hereby corrected as shown below:

Col. 1, line 45:  Change "system" to -- systems --.
       line 61:  Change "tent" to -- tend --.

Col. 4, line 46:  Change "The" to -- As --.

Col. 6, line 41:  Change "the" to -- this --.

Col. 11, line 27:  "25" should be -- 26 --.
       line 32:  "26" should be -- 27 --.

*Signed and Sealed this*

*Twenty-fifth* Day of *June 1985*

[SEAL]

Attest:

DONALD J. QUIGG

*Attesting Officer*    *Acting Commissioner of Patents and Trademarks*